United States Patent
Shigyo et al.

(10) Patent No.: US 10,821,921 B2
(45) Date of Patent: Nov. 3, 2020

(54) ELECTRONIC CONTROL DEVICE

(71) Applicant: Hitachi Automotive Systems, Ltd., Hitachinaka (JP)

(72) Inventors: Toshikazu Shigyo, Hitachinaka (JP); Masaru Kamoshida, Hitachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 0 days.

(21) Appl. No.: 15/535,861

(22) PCT Filed: Jan. 8, 2016

(86) PCT No.: PCT/JP2016/050421
§ 371 (c)(1),
(2) Date: Jun. 14, 2017

(87) PCT Pub. No.: WO2016/114221
PCT Pub. Date: Jul. 21, 2016

(65) Prior Publication Data
US 2017/0334375 A1 Nov. 23, 2017

(30) Foreign Application Priority Data

Jan. 14, 2015 (JP) .................................. 2015-004948

(51) Int. Cl.
*B60R 16/023* (2006.01)
*H01R 13/518* (2006.01)
(Continued)

(52) U.S. Cl.
CPC ....... *B60R 16/0239* (2013.01); *H01R 12/716* (2013.01); *H01R 13/518* (2013.01);
(Continued)

(58) Field of Classification Search
CPC ...... B60R 16/02; B60R 16/0239; H05K 5/03; H05K 5/06; H05K 5/069; H05K 5/0017;
(Continued)

(56) References Cited

U.S. PATENT DOCUMENTS 5,067,905 A * 11/1991 Matsumoto .......... H01R 9/2458
439/76.2
5,575,676 A * 11/1996 Tsukakoshi ...... H01R 13/62911
439/347
(Continued)

FOREIGN PATENT DOCUMENTS

DE 10 2011 088 279 A1 6/2012
DE 10 2012 204 145 A1 9/2013
(Continued)

OTHER PUBLICATIONS

International Search Report (PCT/ISA/210) issued in PCT Application No. PCT/JP2016/050421 dated Mar. 22, 2016 with English translation (4 pages).
(Continued)

*Primary Examiner* — Paresh H Paghadal
(74) *Attorney, Agent, or Firm* — Crowell & Moring LLP

(57) ABSTRACT

The objective of the present invention is to provide an electronic control device with which it is possible to improve the flow of hot water, during molding, between openings through which connectors penetrate, in a case of an electronic control device, the size of which has increased as a result of an increase in the level of functionality of the electronic control device, while suppressing deformation of said case. There are at least three connectors. At least three openings through which the connectors are inserted are provided in one plane in a case. A printed circuit board is housed inside the case, and the connectors are electrically connected thereto. The third opening is disposed between the first opening and the second opening. The third opening
(Continued)

is disposed in a position furthest from a center C of a plane, in the longitudinal direction of the case.

12 Claims, 8 Drawing Sheets

(51) Int. Cl.
| | |
|---|---|
| *H02G 3/16* | (2006.01) |
| *H05K 5/00* | (2006.01) |
| *H01R 12/71* | (2011.01) |
| *H01R 24/76* | (2011.01) |
| *H05K 7/20* | (2006.01) |
| *H01R 107/00* | (2006.01) |

(52) U.S. Cl.
CPC ............... *H01R 24/76* (2013.01); *H02G 3/16* (2013.01); *H05K 5/0017* (2013.01); *H05K 5/0069* (2013.01); *H05K 7/20854* (2013.01); *H01R 2107/00* (2013.01)

(58) Field of Classification Search
CPC .. H05K 5/0026; H05K 5/0043; H05K 5/0047; H05K 7/20845; H05K 7/20854; H05K 7/209; H02G 3/14; H02G 3/16; H01R 12/58; H01R 12/585; H01R 12/7064; H01R 12/716; H01R 13/60; H01R 13/74; H01R 13/741; H01R 13/52; H01R 13/5213; H01R 13/518
See application file for complete search history.

(56) References Cited

U.S. PATENT DOCUMENTS

| | | | | | |
|---|---|---|---|---|---|
| 6,172,302 | B1* | 1/2001 | Kasai | ................... | B60R 16/0215 |
| | | | | | 174/541 |
| 6,224,397 | B1* | 5/2001 | Nakamura | ............... | H01R 9/24 |
| | | | | | 439/76.2 |
| 6,434,013 | B2* | 8/2002 | Kitamura | ............. | H05K 5/0039 |
| | | | | | 174/50 |
| 6,814,591 | B2* | 11/2004 | Oka | ....................... | H01R 13/03 |
| | | | | | 439/76.2 |
| 6,870,096 | B2* | 3/2005 | Suzuki | ............... | B60R 16/0239 |
| | | | | | 174/50 |
| 9,320,165 | B2* | 4/2016 | Gruber | ..................... | H05K 5/03 |
| 9,370,126 | B2* | 6/2016 | Hashikura | ........... | B60R 16/0238 |
| 2001/0002618 | A1 | 6/2001 | Hosoi et al. | | |
| 2002/0016093 | A1* | 2/2002 | Nakamura | ................ | H01R 9/24 |
| | | | | | 439/76.2 |
| 2003/0035278 | A1* | 2/2003 | Lawlyes | ............. | B60R 16/0239 |
| | | | | | 361/796 |
| 2003/0236008 | A1* | 12/2003 | Kita | ................... | H01R 13/6335 |
| | | | | | 439/76.2 |
| 2004/0007379 | A1* | 1/2004 | Suzuki | ................... | H05K 7/026 |
| | | | | | 174/59 |
| 2007/0264867 | A1* | 11/2007 | Harmelink | ........... | H01R 13/518 |
| | | | | | 439/500 |
| 2009/0257195 | A1 | 10/2009 | Sano et al. | | |
| 2009/0258543 | A1* | 10/2009 | Keyser | ................ | H05K 5/0069 |
| | | | | | 439/660 |
| 2010/0317239 | A1 | 12/2010 | Achammer et al. | | |
| 2012/0276761 | A1 | 11/2012 | Martin et al. | | |
| 2014/0076772 | A1 | 3/2014 | Azumi et al. | | |

FOREIGN PATENT DOCUMENTS

| | | |
|---|---|---|
| JP | 2000-5860 A | 1/2000 |
| JP | 2009-158796 A | 7/2009 |
| JP | 2011-222523 A | 11/2011 |
| JP | 2012-129017 A | 7/2012 |
| JP | 2014-60307 A | 4/2014 |

OTHER PUBLICATIONS

Japanese-language Written Opinion (PCT/ISA/237) issued in PCT Application No. PCT/JP2016/050421 dated Mar. 22, 2016 (4 pages).
Extended European Search Report issued in counterpart European Application No. 16737292.9 dated Jul. 16, 2018 (eight pages).
Non-final Rejection issued in U.S. Appl. No. 16/831,394 dated May 11, 2020 (18 pages).

* cited by examiner

ELECTRONIC CONTROL DEVICE

TECHNICAL FIELD

The present invention relates to an electronic control device.

BACKGROUND ART

An increase of a size of a case and an increase of the number of connector poles have advanced due to an increase in the level of functionality of electronic control devices, beyond technological progress of miniaturization of electronic components mounted on a board and miniaturization of amounting structure.

On the other hand, it is difficult to easily implement decentralization of the electronic control device and forming a wireless system for reduction of the number of terminal poles of the connector in an electronic control device for an engine mounted in an engine room or an electronic control device for a transmission in a current situation.

As the number of terminal poles of the connector increases, the number of connectors increases or a size of the connector increases. The increase of the size of the connector is a custom-order which is expensive, and it is cheaper to dispose a plurality of general-purpose connectors.

In addition, a copper-based material is predominantly used for a wire harness connected to the connector so that it is difficult to make a wire diameter thin in a current situation. For example, current capacity is also increased due to the increase in the level of functionality in an electronic control device for a direct injection engine with high fuel consumption, and it is difficult to make a wire diameter of a wire harness thin, but it is cheaper to dispose a plurality of connectors, which is predominantly performed.

Here, the case of the electronic control device contributes to improvement of fuel economy required for automobiles, and thus, needs to be reduced in weight contrary to the increase in size. Thus, a technique of molding the case to maintain thinning while suppressing deformation thereof is required. In addition, a case of the electronic control device for the engine mounted in the engine room is required to have a heat dissipation property along with the increase in the level of functionality so that there is a demand for a case which is inexpensive and light and has a high heat dissipation property.

Meanwhile, a compact and inexpensive casing, improved in waterproof seal performance between a case forming the casing in which a circuit board is hermetically housed and a cover, is known (for example, see PTL 1). In a case structure disclosed in PTL 1, a size of the case is generally a square of about 160 mm×160 mm, and the number of connector terminals is about 130 to 160 poles. In the case of PTL 1, two connectors that penetrate through the case and are orthogonal to the board are provided. In addition, a protruding portion which protrudes to outside of the case is provided between the two connectors in order to avoid tall components.

In addition, a control module, which includes a connector having a compliant pin terminal for interfacing to a printed circuit board (PCB), is known (for example, see PTL 2). Three connectors penetrating through a case are provided in the case disclosed in PTL 2. A position of an opening penetrating through the case is aligned at an outer end surface, and a small connector is adopted as only one connector on the end side among the three connectors.

CITATION LIST

Patent Literature

PTL 1: JP 2014-60307 A
PTL 2: JP 2011-222523 A

SUMMARY OF INVENTION

Technical Problem

In a high-functional electronic control device mounted in an engine room, a size of a case is a rectangle of about 240 mm×160 mm, which is large. It is necessary to provide three or more connectors penetrating through the case, and the number of connector terminals requires 180 poles or more for input and output. Therefore, it is necessary to provide three or more penetrating openings in the case.

In the structure disclosed in PTL 1, the amount of deformation of the case occurring in the periphery of the penetrating connector opening is not remarkable. However, when a case of an electronic control device is larger by 1.5 times or more and the number of connectors penetrating through the case is three or more, strength of the case decreases depending on the penetrating area thereof as the number of openings increases. Therefore, the deformation amount of the case in the periphery of the opening becomes larger than that in the conventional structure, and it is necessary to suppress the deformation amount. In particular, when an overlap region in a longitudinal direction of the opening is large between the penetrating opening and opening, it is necessary to suppress the deformation amount of the case.

Further, it is usual that internal pressure is applied to the case in a change in pressure inside the case caused by a change in temperature, and a center of the case is deformed to curve outward. For this reason, the deformation amount of the case in the periphery of the opening through which the connector penetrates becomes maximum, the deformation is also transmitted to a clearance between the connector and the opening or a seal material provided between the connector and the opening, which causes seal failure. Therefore, it is required to suppress the deformation amount of the case. In addition, when the deformation is transmitted not only to the seal material but also to the connector, cracks or the like affect solder to join the terminal of the connector and the board, and thus, it is necessary to suppress the deformation amount of the case.

Further, a convex portion having a constant wall thickness is provided between the connectors penetrating through the case in the structure disclosed in PTL 1. However, an effect of enhancing the strength of the case is small since the wall thickness is thin and constant, and accordingly, it is necessary to suppress the deformation amount.

In addition, all positions of the openings penetrating through the case are aligned on the outer end surface side in the structure disclosed in PTL 2. Since the openings are aligned without being dispersed, the strength of the case decreases, and the deformation amount increases. In addition, when the positions of the openings are aligned on the outer end surface, a region in which the opening and the opening overlap in the longitudinal direction increases, and the flow of hot water at the time of forming the case also deteriorates. It should be noted that the flow of hot water means the flow of a material melted at high temperature.

The deterioration of the flow of hot water causes molding failure, such as a nest and a weld mark, which causes deterioration of heat conduction or cracks and affects not only the deformation but also the strength and appearance. Further, the deformation of the case becomes the largest in the periphery of the connector in the middle that is large although the size of the connector on the end side is small among the three connectors, which is not the structure that suppresses the deformation amount of the case.

An object of the present invention is to provide an electronic control device capable of improving the flow of hot water during molding between openings through which connectors penetrate while suppressing deformation of a case of the electronic control device, the size of which has increased as a result of an increase in the level of functionality of the electronic control device.

Solution to Problem

In order to achieve the above-described object, the present invention is configured to include: at least three connectors; a case in which at least three openings through which the connectors are inserted are provided in one plane; a board which is housed inside the case and to which the connectors are electrically connected. A third opening is disposed between a first opening and a second opening. The third opening is disposed in a position farthest from a center of the plane in a longitudinal direction of the case.

Advantageous Effects of Invention

According to the present invention, it is possible to improve the flow of hot water during molding between the openings through which the connectors penetrate while suppressing the deformation of the case of the electronic control device of which the size has increased as the result of the increase in the level of functionality of the electronic control device. Other objects, configurations, and effects which have not been described above become apparent from embodiments to be described hereinafter.

DESCRIPTION OF EMBODIMENTS

Figure 1:
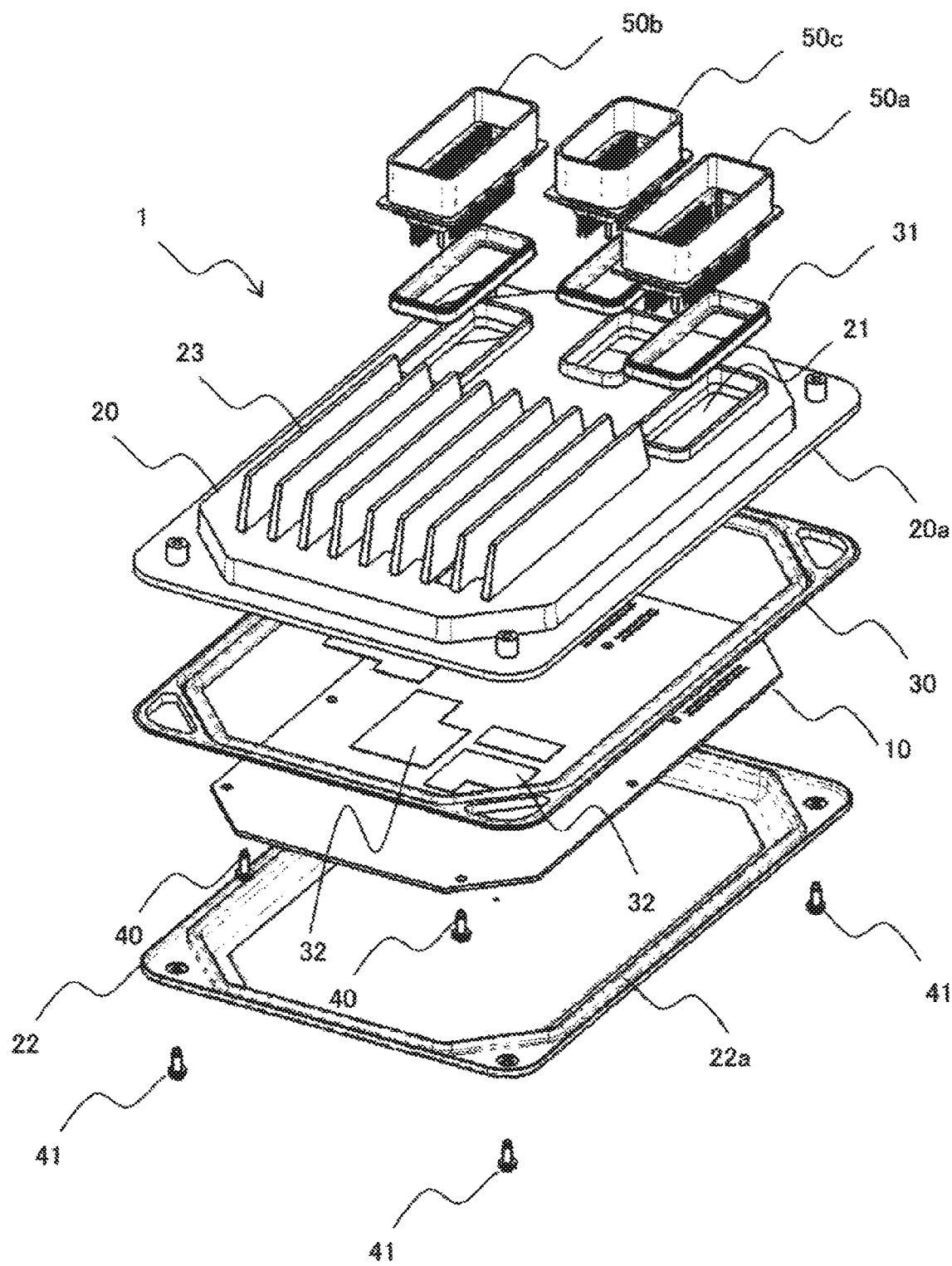
FIG. 1 is a perspective view of an electronic control device according to a first embodiment of the present invention.

Hereinafter, configurations and operational effects of electronic control devices according to first to sixth embodiments of the present invention will be described with reference to the drawings. The electronic control device controls, for example, an engine, a transmission, and the like. In the respective drawings, the same parts will be denoted by the same reference numerals.

First Embodiment

Figure 2:
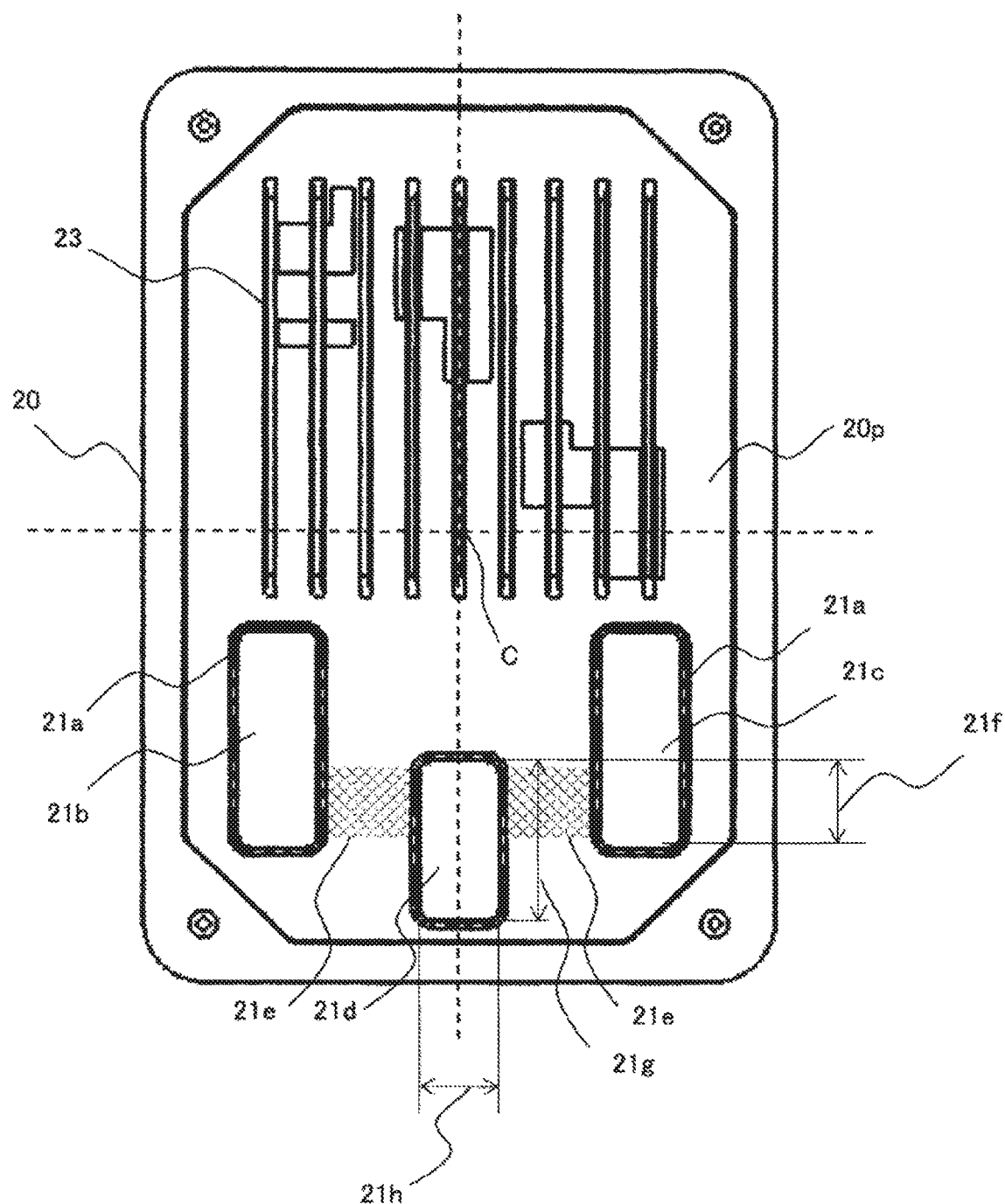
FIG. 2 is a front view of a main part of a case of the electronic control device according to the first embodiment of the present invention.
Figure 3:
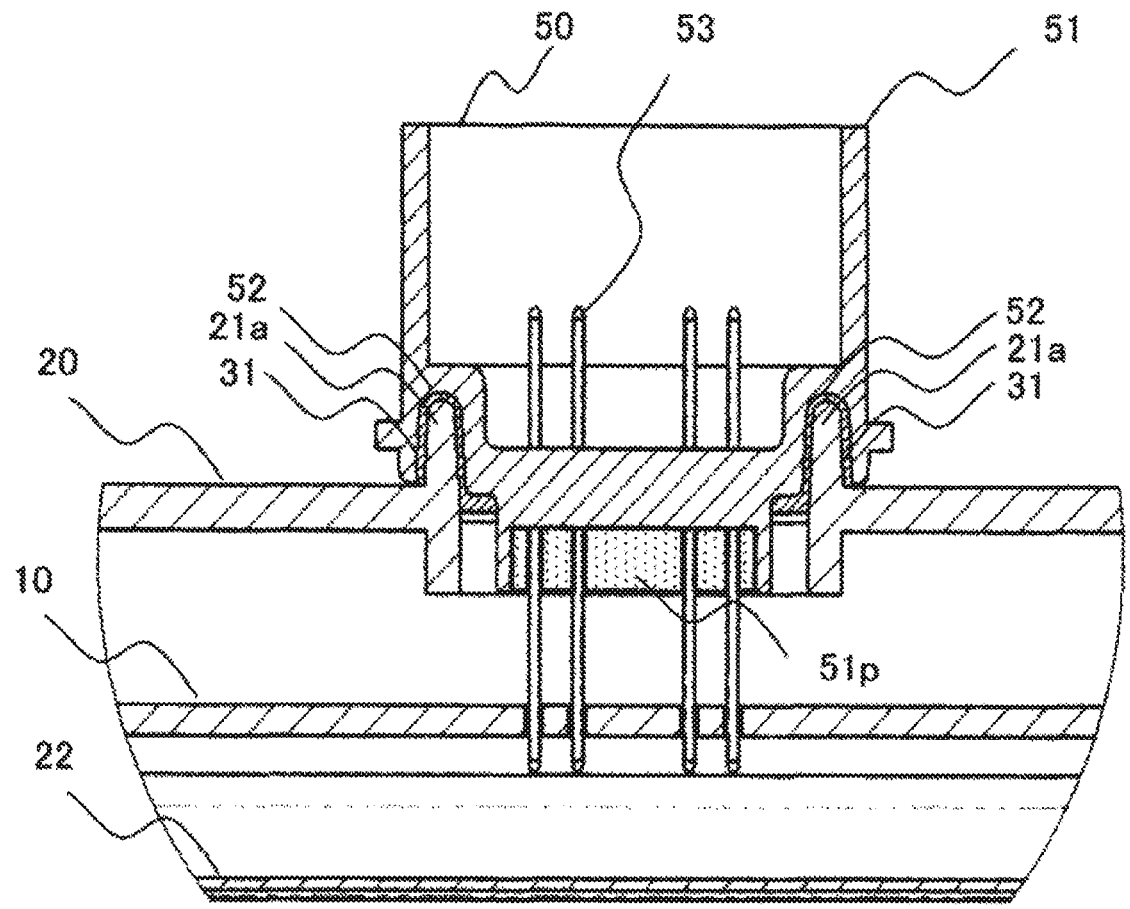
FIG. 3 is a cross-sectional view of a main part of the electronic control device according to the first embodiment of the present invention.

FIG. 1 is a perspective view of an electronic control device 1 according to a first embodiment of the present invention. Incidentally, electronic components mounted to a board and the like are not illustrated in order to make the drawing easy to see. FIG. 2 is a front view of a main part of a case of the electronic control device 1 according to the first embodiment of the present invention. FIG. 3 is a cross-sectional view of a main part of the electronic control device 1 according to the first embodiment of the present invention.

As illustrated in FIG. 1, the electronic control device 1 mainly includes a printed wiring board 10, a case 20, a cover 22, and three connectors 50 (50a to 50c).

Electronic components and the like are mounted to the printed wiring board 10. The case 20 protects the printed wiring board 10. At least three openings 21b, 21c, and 21d through which the connectors 50 are inserted are provided on a plane 20p of the case 20.

The cover 22 seals an opening portion of the case 21 by being fixed to the case 21. The connector 50 is electrically connected to the printed wiring board 10. The seal material 30 waterproofs a space between an opening edge portion 20a of the case 20 and an inner surface of a peripheral edge portion 22b of the cover 22. As illustrated in FIG. 3, a seal material 31 waterproofs a space between a housing groove 52 of the connector 50 and a plurality of convex portions 21a around the openings penetrating through the case 20.

Returning to FIG. 1, the printed wiring board 10 is fixed to the case 20 using screws 40. Here, a heat dissipation adhesive 32 is interposed between the printed wiring board 10 and the case 20. The cover 22 is fixed to the case 20 using screws 41.

The case 20 accommodates the printed wiring board 10 therein together with the cover 22, and protects the printed wiring board 10 to which the electronic components are mounted from water, foreign matters and the like. The case 20 is preferably made of metal, suitably aluminum, in order to dissipate heat generated by the electronic components and to shield noise. The case 20 is molded by an aluminum die-cast molding method using a metal mold.

The material of the case 20 may be resin in the case of the electronic control device 1 configured of the electronic components that do not require heat dissipation or shielding. When the resin is used, the case 20 is molded by an injection molding method.

As illustrated in FIG. 2, an outer shape of the case 20 has a size of 240 mm×160 mm, which is relatively large in the electronic control device 1 disposed in an engine room, and has a rectangular shape. An electronic control device disclosed in PTL 1 generally has a size of about 160 mm×160 mm, but the electronic control device 1 according to the present embodiment has a size which is 1.5 times of the size of the electronic control device disclosed in PTL 1 or larger.

The three or more penetrating openings 21 are provided in the case 20. The third opening 21*d* is disposed outside of either the first opening 21*b* or the second opening between (in the middle of) the first opening 21*b* and the second opening 21*c*. That is, the third opening 21*d* is disposed at a position farthest from a center C of the plane 20*p* in the longitudinal direction of the case 20.

Since the openings are not aligned, deformation is dispersed, and it is possible to suppress the deformation amount of deformation of the case. Accordingly, a resonance frequency is suppressed. In addition, it is possible to disperse heat transmitted from a terminal. It is possible to increase an area for mounting the electronic components and to reduce a wiring overlap of pattern wiring of the printed wiring board.

The openings 21*b*, 21*c*, and 21*d* are rectangular and disposed so that long sides of the openings are parallel to each other. A distance from the center C of the plane 20*p* to a short side at the center C side of the first opening 21*b* is equal to a distance from the center C of the plane to a short side at the center C side of the second opening 21*c*.

The opening 21 may be a hole through which the connector 50 is inserted or a hole through which a breathing filter is inserted. In the case of the present embodiment, the opening 21 is a hole having a function of allowing the connector 50 to penetrate therethrough.

In the case 20, the penetrating opening 21 is preferably provided at an outer side from the center of the case since pressure is applied inside the case 20 and a central portion of the case 20 is maximally deformed in an uneven direction under environment of transport and use of an automobile such as a change in altitude and a change in temperature. In particular, the opening 21*d* in the middle contributes to suppressing the deformation amount of the case by being disposed at the outermost side.

Heat dissipation fins 23 to increase heat capacity are provided on the opposite side to a size where the openings 21 are disposed on an outer side surface of the case 20. As illustrated in FIG. 1, an orientation of the heat dissipation fin 23 is parallel to the long side of the case 20, but may be parallel to the short side of the case 20. The orientation of the heat dissipation fin 23 are desirably parallel in a direction toward an overflow from a gate during molding by the aluminum die-cast molding method.

It is possible to conceive the following two kinds of positions of the gate and the overflow at the time of molding by the aluminum die-cast molding method.

(First Combination of Gate and Overflow)

First, the gate is provided on a surface (an upper surface or a side surface in contact with the short side) near the short side of the rectangular case 20 on the opposite side to the opening 21 so as to be parallel to a longitudinal direction of the connector 50 and the heat dissipation fin 23. On the other hand, the overflow is provided on a surface near the short side of the case 20 on the opposite side to the gate.

Since a space between the opening 21 and the opening 21 is narrow, the flow of hot water deteriorates. Then, the third opening 21*d* in the middle is provided at the outer side. Accordingly, a region 21*e* in which a space between the first opening 21*b* and the third opening 21*d* and a space between the second opening 21*c* and the third opening 21*d* overlap in the longitudinal direction is reduced as illustrated in FIG. 2, and it is possible to suppress the deformation amount of the case and to improve the flow of hot water in the case.

(Second Combination of Gate and Overflow)

In addition, the gate is provided on a surface (an upper surface or a side surface in contact with the long side) near the long side of the rectangular case 20. On the other hand, the overflow is provided on a surface near the long side on the opposite side to the gate.

Similarly to the first combination, the third opening 21*d* in the middle is provided at the outer side. Accordingly, the region 21*e* in which the space between the first opening 21*b* and the third opening 21*d* and the space between the second opening 21*c* and the third opening 21*d* overlap in the longitudinal direction is reduced, and it is possible to suppress the deformation amount of the case and to improve the flow of hot water in the case.

In particular, the third opening 21*d* in the middle is formed to have a smaller area than the first opening 21*b* or the second opening 21*c*. To be specific, at least one of a length 21*g* of the third opening 21*d* in the longitudinal direction and a width 21*h* (a length in a lateral direction) of the third opening is shortened with respect to the first opening 21*b* and the second opening 21*c*.

When the length 21*g* of the third opening 21*d* in the longitudinal direction is shortened, a length 21*e* overlapping in the longitudinal direction is shortened, the region 21*e* overlapping in the longitudinal direction is reduced, and there are the effects of suppressing the deformation amount of the case and improving the flow of hot water. On the other hand, when the width 21*h* of the third opening is shortened, a distance between the openings increases, and it is possible to obtain the same effects.

When the flow of hot water is improved, the entrainment of air is reduced, there is no defect in aluminum die-casting, such as a nest and a weld mark, the amount of aluminum flowing to the overflow decreases, and there is an advantage that it possible to perform the molding thereof inexpensively. On the other hand, when the flow of hot water is poor and there is the molding failure, such as the nest and the weld mark, the deterioration of heat conduction and cracks are caused, and not only the deformation but also the strength and the appearance are affected.

A plurality of bases configured to fix the printed wiring board 10 are provided inside the case 20. To be specific, a tapped base configured to fasten the screw 40 and a base with surface accuracy to which the heat dissipation adhesive 32 is applied are provided. A base which is fixed to the cover 22 via the screw 41 is also provided in the case 20.

The electronic components and the like are mounted to the printed wiring board 10 using a conductive alloy such as solder. It is also possible to mount the electronic components and the like to both surfaces of the printed wiring board 10. The electronic components include passive components such as resistors and capacitors and active components such as semiconductors, and are mounted to the printed wiring board by a surface mounting method or an insertion mounting method. It is desirable to adopt electronic components with long service life that can withstand under the environment of the engine room for the automobile. In order to increase the mounting density, a high-density ball grid array (BGA) and a quad for non-lead package (QFN) are mounted together with a quad flat package (QFP) as a package of the electronic components.

The BGA has an electrode which is formed in a hemispherical shape by surface tension of a conductive alloy to terminal aligned in a grid pattern on a bottom surface of the package and is joined to the printed wiring board 10 by reflow. The QFN has a shorter terminal than the QFP and is connected to the printed wiring board 10 using a conductive alloy. When the deformation amount of the printed wiring board 10 is large, a joining portion is likely to receive stress in such a structure, and it is necessary to suppress the deformation amount of the printed wiring board 10.

The printed wiring board 10 is fixed to the tapped base of the case 20 together with the plurality of screws 40. At that time, the printed wiring board 10 and the base having the surface accuracy of the case 20 are fixed so as to sandwich the heat dissipation adhesive 32 therebetween. Since the size of the printed wiring board 10 is relatively large in the electronic control device 1 disposed in the engine room, the four or seven screws 40 are used for fixing.

In regard to positions of the screws 40, the respective screws are desirably disposed to have equal distances therebetween considering four corners of the printed wiring board 10 and the disposition of the electronic components. In particular, distortion occurs in the printed wiring board 10 near the screw 40. Therefore, it is desirable to provide the disposition in which there is no distortion in the connector 50, the BGA, and the joining portion of the QFN using the conductive alloy. That is, the screw 40 is not disposed near the connector 50 and the joining portion using the conductive alloy.

In addition, the screw 40 has a function as a case ground and is electrically connected to the case 20 via the screw 40 and a GND wiring pattern of the printed wiring board 10. It is desirable for the case ground to be located at the four corners of the printed wiring board 10 in terms of routing of the wiring pattern of the printed wiring board 10.

The printed wiring board 10 is preferably a glass epoxy board impregnated with epoxy resin on a cloth made of glass fiber superimposed. The printed wiring board 10 is a multilayered board in which an insulator and a pattern are stacked on each other and is a multilayered board of 4 layers to 6 layers since the high-density mounting is required therein. In addition, it is suitable to use a penetrating plate for wiring between the layers with a through hole that penetrates through the layers and a built-up plate formed by a build-up method.

The heat dissipation adhesive 32 transfers the heat generated by the electronic component to the base having the surface accuracy of the case 20 through a via of the printed wiring board. The thinner the thickness of the heat dissipation adhesive 32 is, the more easily the generated heat is transferred. When the case 20 is deformed to the outer side (in the direction from the inside of the paper of FIG. 2 to the front side), a clearance between the case 20 and the printed wiring board 10 is widened, and thus, heat dissipation performance deteriorates. Therefore, it is effective to suppress the deformation of the case 20 in order to maintain the heat dissipation performance. The heat-generating electronic component that needs to dissipate heat is disposed under the heat dissipation fin 23.

As illustrated in FIG. 3, the connector 50 is configured of a housing 51, a terminal 53, and a potting material 51p.

The terminal 53 is press-molded with a copper-based material having high thermal conductivity. A shape of the terminal 53 is a straight line, and s tip end thereof is crushed so as to be easily invited to the connector on a harness side or the through hole of the printed wiring board. The housing 51 is molded using resin by an injection molding method, and the terminal 53 is press-fitted thereto. The housing 51 may be molded by an insertion molding method so that the terminal 53 and the resin are integrated. The potting material 51p is provided in order to airtight a gap between the housing 51 and the terminal 53.

The size of the connector 50 depends on the number of poles of the terminal 53 and the width of the terminal 53, and the length 21g in the longitudinal direction and the width 21h of the opening illustrated in FIG. 2 are determined. The terminal 53 has about 60 to 80 poles in total including a signal system terminal and a power system terminal together with a difference in current capacity. The power system terminal is wider.

The terminal 53 and the penetrating through hole of the printed wiring board 10 are connected using a conductive alloy (not illustrated) such as solder. In addition, a press-fit terminal (not illustrated) may be used as the terminal 53, and the terminal 53 and the printed wiring board 10 may be mechanically and electrically connected.

The third connector 50c among the three connectors 50 is provided between the first connector 50a and the second connector 50b. Similarly to the opening 21 of the case, the third connector 50c in the middle is disposed on the outermost side. Although there are three connectors in the present embodiment, the number of connectors is not limited to three, and three or more connectors may be used. Accordingly, the number of the openings 21 of the case becomes three or more. When the third connector 50c is disposed on the outermost side, it is possible to increase the area for mounting the electronic components. In addition, the wiring pattern of the printed wiring board 10 does not have high density, and it is also possible to avoid the wiring overlap of the pattern wiring.

In assembly of the connector 50 according to the present embodiment, the connector 50 is connected to the case 20 from the outer surface side of the case 20 via the seal material 31 on the outer surface side of the case 20, and the terminal 53 is connected to the printed wiring board 10. The terminal 53 may be first connected to the printed wiring board 10, and then, the connector 50 may be connected to the case 20 from an inner surface side of the case 20 via the seal material 31 on the inner surface side of the case 20. However, connection of the connector 50 from the outside of the case 20 has an advantage that it is possible to miniaturize the seal structure of the connector 50.

Next, a detailed method of connecting the connector 50 to the case 20 will be described with reference to FIG. 3. A housing groove 52 in which the seal material 31 is embedded is provided around a bottom of the housing 51 of the connector 50. The housing groove 52 is fitted to the convex portion 21a around the opening 21 of the case 20. When the seal material 31 is cured, the space between the connector 50 and the case 20 is sealed.

A labyrinth structure is formed using a depth of the housing groove 52 and a height of the convex portion 21a of the opening 21 of the case 20 to protect the electronic components from foreign matters such as salt water so as to satisfy a condition required by the environmental specification of the engine room. Since the seal material 31 is filled in the clearance between the housing groove 52 and the convex portion 21a of the opening 21 of the case 20, the clearance and the amount of the seal material 31 are determined in consideration of an assembling error.

For example, when the case 20 expands under the influence of heat or pressure and the periphery of the connector 50 is deformed to the outer side of the case 20, the seal material 31 functions as a buffer material. Since the clearance is small, however, when the deformation occurs in the case 20 exceeding the function as the buffer material, the connector 50 also deforms at the same time. The deformation of the connector 50 also affects the terminal 53, and the deformation is also transmitted to the printed wiring board 10 via the conductive adhesive at the same time.

The seal material 31 is preferably a silicone adhesive having heat resistance, water resistance, chemical resistance, and flexibility in order to protect the electronic components from the foreign matters such as salt water.

As illustrated in FIG. 1, a peripheral edge portion 22b is provided on the entire inner periphery of the cover 22. A seal material 30 is applied between the peripheral edge portion 22b of the cover 22 and the opening edge portion 20a of the case 20 to protect the electronic components from the foreign matters such as salt water.

An iron-based or aluminum-based steel plate is preferably used as the material of the cover 22, but resin or aluminum die-cast may be used. When the cover 22 is made of metal, influence of an electromagnetic wave is not applied to the outside. In addition, there is less influence of the electromagnetic wave than the case of using other materials.

Similarly to the seal material 31, the seal material 30 is preferably a silicon adhesive. In particular, in regard to the long side of the case 20, since internal pressure is applied to the case 20 in the pressure change inside the case 20 caused by the temperature change, and the center of the case 20 is deformed to curve outward, a center of the long side of the case 20 is deformed the most. Therefore, the seal material 30 is configured to have an adhesive force capable of withstanding deformation.

In the cover 22, holes through which the screws 41 to be fixed to the case 20 penetrate are provided at four corners. The cover 22 and the case 20 are fixed by the screws 41, together with the seal material 30. It is desirable to dispose the screws 41 at the four corners of the cover 22 so that an application trajectory of the seal material 30 is not complicated. Since the size of the electronic control device is 1.5 times larger than that of the conventional electronic control device in the present embodiment, the thin material is selected as the cover 22, and ribs, dimples, steps and the like are provided to secure the strength.

According to the present embodiment, it is possible to improve the flow of hot water during molding between the openings through which the connectors penetrate while suppressing the deformation of the case of the electronic control device of which the size has increased as the result of the increase in the level of functionality of the electronic control device.

Second Embodiment

Figure 4:
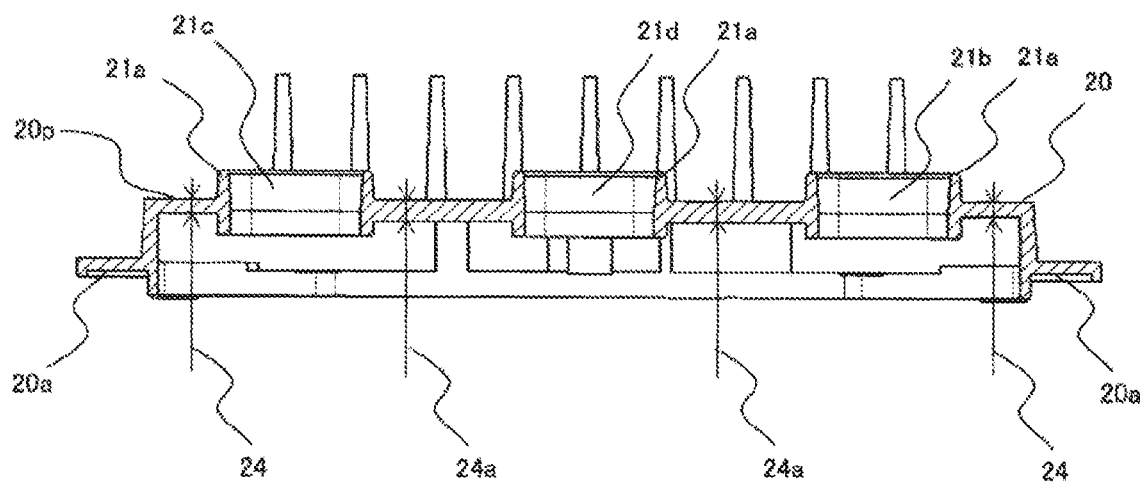
FIG. 4 is a cross-sectional view of a main part of a case of an electronic control device according to a second embodiment of the present invention.

FIG. 4 is a cross-sectional view of a main part of a case of the electronic control device 1 according to the second embodiment of the present invention. As illustrated in FIG. 4, a wall thickness of the case 20 serving as a reference is a wall thickness 24. A wall thickness between the first opening 21b and the third opening 21d and a wall thickness between the second opening 21c and the third opening 21d are a wall thickness 24a. Here, the wall thickness 24a is larger than the wall thickness 24 serving as the reference.

That is, a thickness of the case 20 in a first region between the first opening 21b and the third opening 21d and a thickness of the case 20 in a second region between the second opening 21c and the third opening 21d are larger than a thickness of a third region excluding the first region and the second region in the plane 20p.

It is possible to increase strength of the periphery of the third opening 21d in which the deformation amount of the case 20 is the largest and the region 21e overlapping in the longitudinal direction, and to suppress the deformation amount in the periphery of the third opening 21d and the region 21e overlapping in the longitudinal direction. In addition, a sectional area is increased by increasing the wall thickness. Thus, the flow velocity becomes slow during the aluminum die-cast molding, and it is possible to control the flow of hot water in the region 21e overlapping in the longitudinal direction and to improve circulation of the hot water.

According to the present embodiment, it is possible to improve the flow of hot water during molding between the openings through which the connectors penetrate while suppressing the deformation of the case of the electronic control device of which the size has increased as the result of the increase in the level of functionality of the electronic control device.

Third Embodiment

Figure 5:
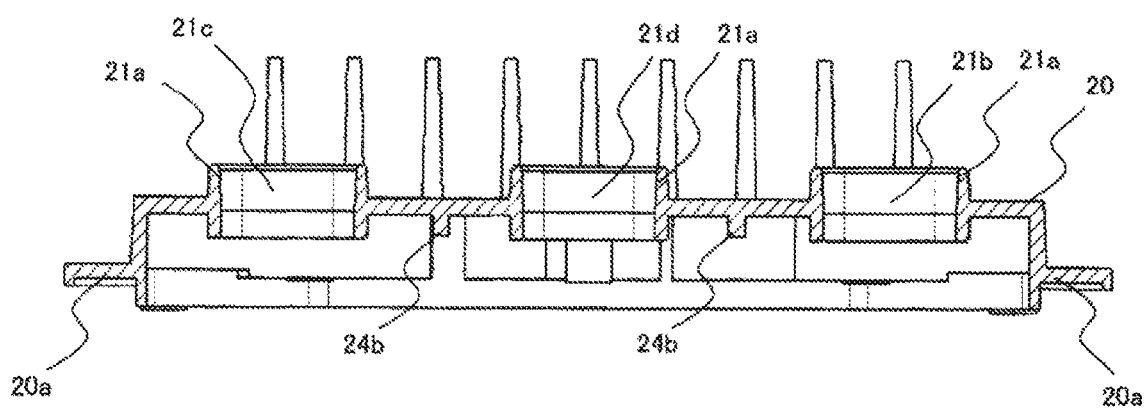
FIG. 5 is a cross-sectional view of a main part of a case of an electronic control device according to a third embodiment of the present invention.

FIG. 5 is a cross-sectional view of a main part of a case of the electronic control device 1 according to the third embodiment of the present invention. As illustrated in FIG. 5, ribs 24b are provided between the first opening 21b and the third opening 21d and between the second opening 21c and the third opening 21d in the case 20. The ribs 24b may be provided inside or outside the case 20. When the rib 24b is provided inside the case 20, the rib 24b has a height not to interfere with the electronic component.

However, no interference occurs in the periphery of the opening 21 since the periphery of the opening 21 is the periphery of the connector 50, there is no space to dispose an electronic component, and it is difficult to dispose a large electronic component. In addition, the printed wiring board 10 and the terminal 53 are joined using a conductive alloy by spot flow, and thus, it is necessary to avoid a jig for joining. Since it is difficult to dispose a larger electronic component, there is no interference with the rib 24b.

Further, distortion occurs in the periphery the connector 50 in the case 20, and thus, a large and tall electronic component is not generally disposed, so that it is possible to avoid interference. When the rib 24b is provided outside the case 20, it is difficult to make the height of the rib 24b high since a female connector on a vehicle side to be fitted to the connector 50 is assembled. Therefore, it is preferable to dispose the rib 24b inside the case 20.

It is possible to increase the strength of the periphery of the third opening 21d in which the deformation amount of the case 20 is the largest and the region 21e overlapping in the longitudinal direction, and to suppress the deformation amount of the periphery of the third opening 21d and the region 21e overlapping in the longitudinal direction. A sectional area is increased by providing the ribs 24b. Thus, the flow velocity becomes slow during the aluminum die-cast molding, and it is possible to control the flow of hot water in the region 21e overlapping in the longitudinal direction and to improve circulation of the hot water.

According to the present embodiment, it is possible to improve the flow of hot water during molding between the openings through which the connectors penetrate while suppressing the deformation of the case of the electronic control device of which the size has increased as the result of the increase in the level of functionality of the electronic control device.

Fourth Embodiment

Figure 6:
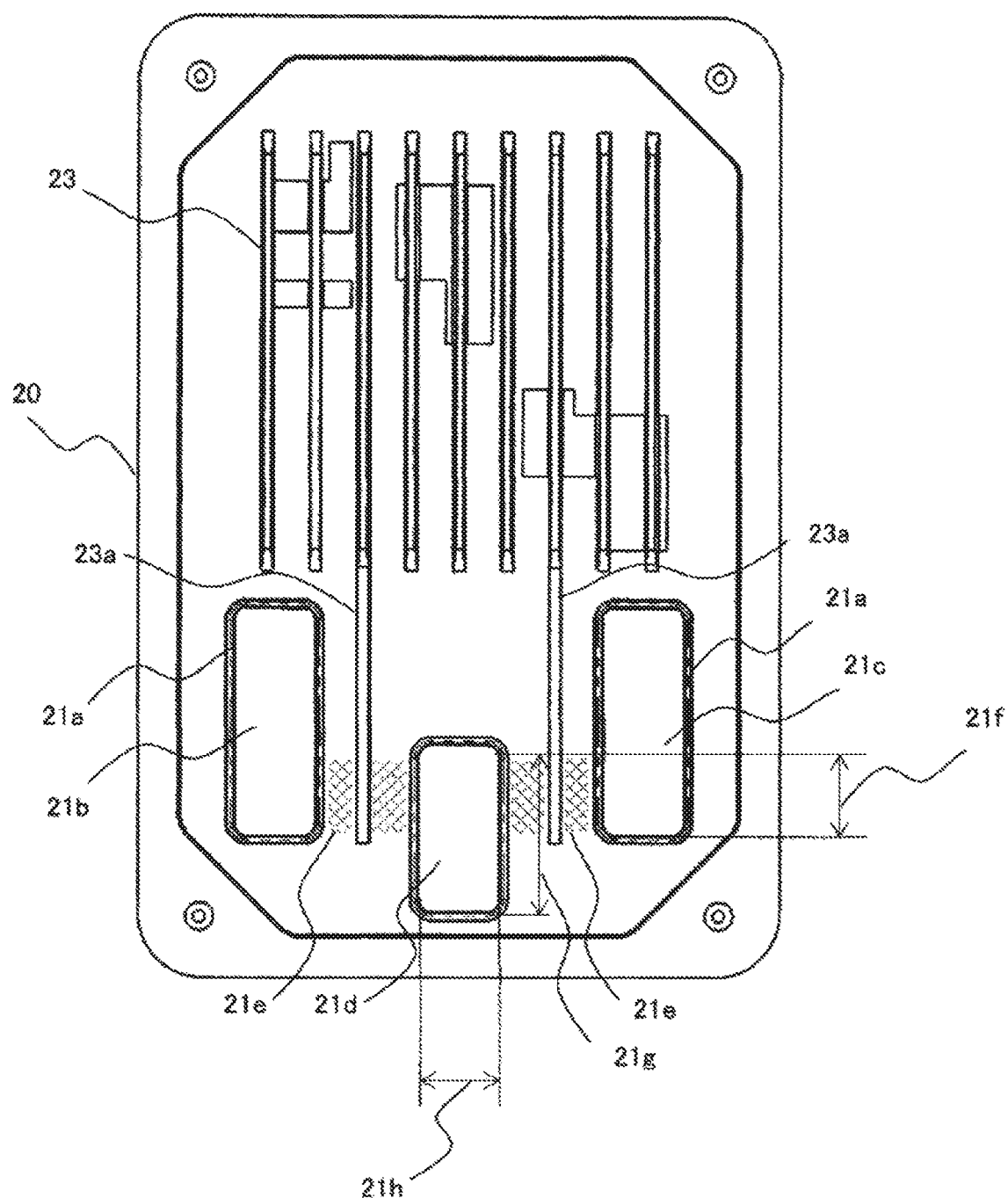
FIG. 6 is a front view of a main part of a case of an electronic control device according to a fourth embodiment of the present invention.

FIG. 6 is a front view of a main part of a case of the electronic control device 1 according to the fourth embodiment of the present invention. As illustrated in FIG. 6, an extension portion 23a obtained by extending the heat dissipation fin 23 is provided between the first opening 21b and the third opening 21d and between the second opening 21c and the third opening 21d in the case 20. Since a female connector on a vehicle side to be fitted to the connector 50 is assembled, a height of the extension portion 23a is set to a height that does not interfere with the female connector. That is, the height of the extension portion 23a is lower than the height of the heat dissipation fin 23.

Accordingly, it is possible to increase the strength of the periphery of the third opening 21d in which the deformation amount of the case 20 is the largest and the region 21e overlapping in the longitudinal direction, and to suppress the deformation amount of the periphery of the third opening 21d and the region 21e overlapping in the longitudinal direction. A sectional area of the region 21e overlapping in the longitudinal direction is increased by extending the heat dissipation fin 23. Thus, the flow velocity becomes slow during the aluminum die-cast molding, and it is possible to control the flow of hot water in the region 21e overlapping in the longitudinal direction and to improve circulation of the hot water. In addition, since the heat dissipation fin 23 is extended, it is possible to cause the hot water to flow to the extension portion 12a simultaneously to the heat dissipation fin 23, and thus, the flow of hot water becomes favorable.

According to the present embodiment, it is possible to improve the flow of hot water during molding between the openings through which the connectors penetrate while suppressing the deformation of the case of the electronic control device of which the size has increased as the result of the increase in the level of functionality of the electronic control device.

Fifth Embodiment

Figure 7:
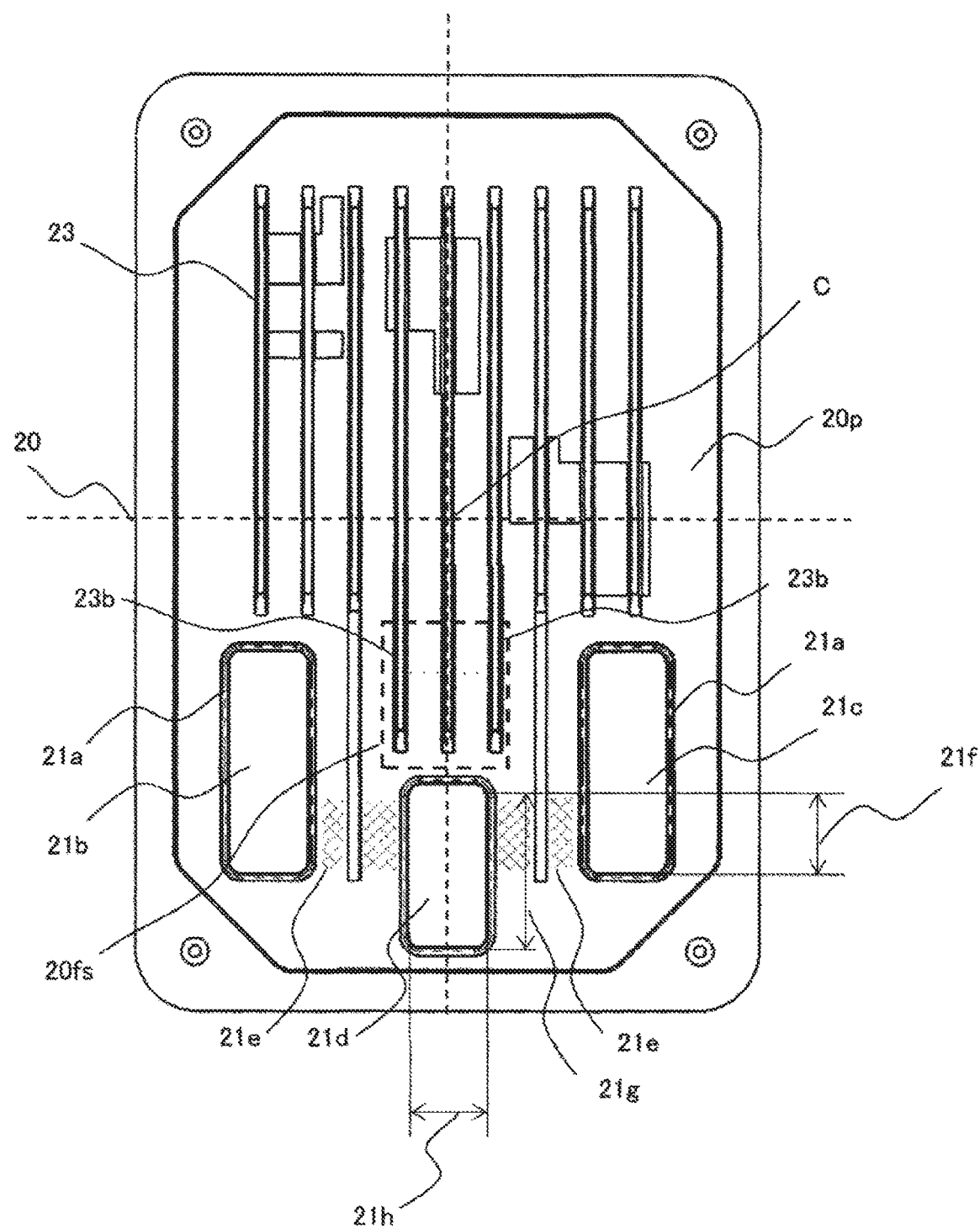
FIG. 7 is a front view of a main part of a case of an electronic control device according to a fifth embodiment of the present invention.

FIG. 7 is a front view of a main part of a case of the electronic control device 1 according to the fifth embodiment of the present invention. As illustrated in FIG. 7, an extension portion 23b obtained by extending the heat dissipation fin 23 is provided in a region 20fs formed by disposing the third opening 21d in which the deformation amount of the case 20 is the largest on the outer side.

That is, the case 20 is provided with the extension portion 23b obtained by extending the heat dissipation fin 23 to the front side of a short side of the third opening 21d on the center C side of the plane 20p. Incidentally, a height of the extension portion 23b is the same as that of the heat dissipation fin 23.

Accordingly, the sectional area of the periphery of the third opening 21d in which the deformation amount of the case 20 is the largest increases, and it is possible to increase the strength and to suppress the deformation amount in the periphery of the third opening 21d and the region 21e overlapping in the longitudinal direction. It is possible to cause the hot water to flow to the extension portion 23b simultaneously to the heat dissipation fin 23 during the aluminum die-cast molding by extending the heat dissipation fin 23, and thus, the flow of hot water becomes favorable.

According to the present embodiment, it is possible to improve the flow of hot water during molding between the openings through which the connectors penetrate while suppressing the deformation of the case of the electronic control device of which the size has increased as the result of the increase in the level of functionality of the electronic control device.

Sixth Embodiment

Figure 8:
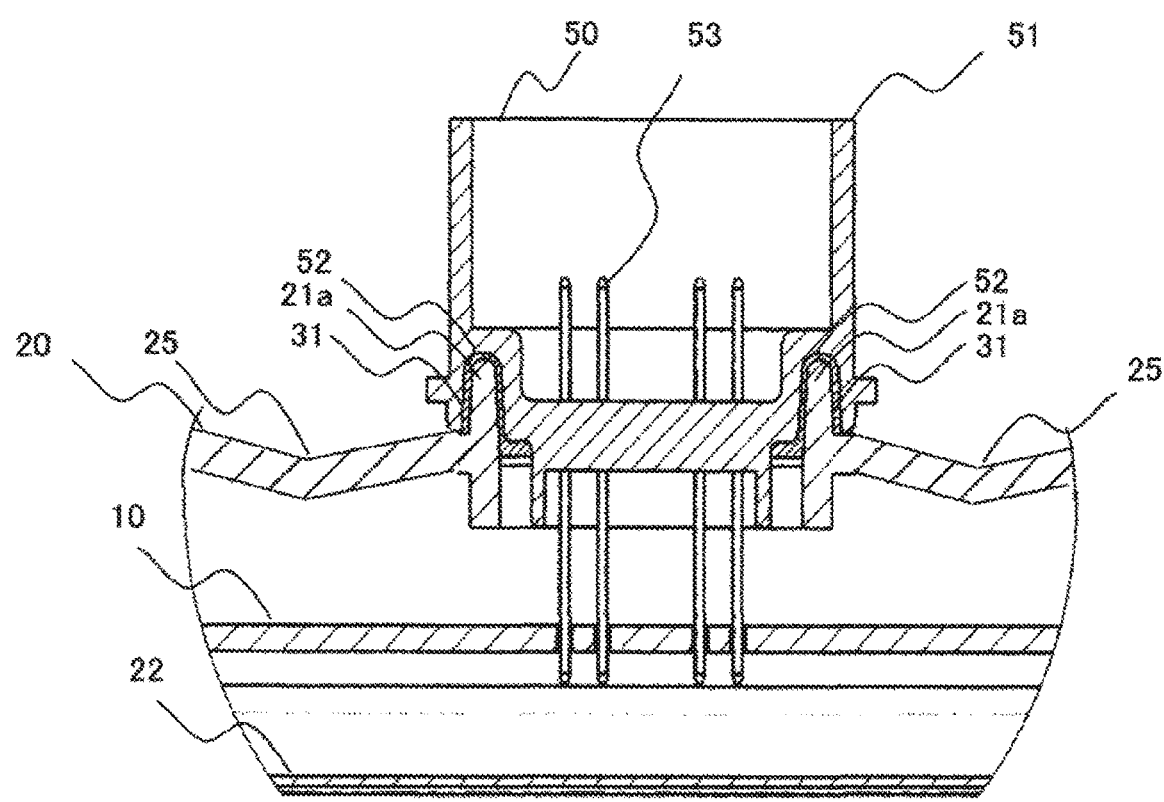
FIG. 8 is a cross-sectional view of a main part of a case of an electronic control device according to a sixth embodiment of the present invention.

FIG. 8 is a cross-sectional view of a main part of a case of the electronic control device 1 according to the sixth embodiment of the present invention. As illustrated in FIG. 8, a V-shaped groove 25 (a groove having a V-shaped cross section) is provided between the first opening 21b and the third opening 21d or between the second opening 21c and the third opening 21d in the case 20. With the V-shaped groove 25, the salt water or the foreign matters can be drained without stopping in the periphery of the seal material 31, and it is possible to prevent corrosion of the seal material 31 and to protect adhesion reliability for a long term.

In addition, it is possible to suppress the deformation of the case 20 since the V-shaped groove 25 is strong against a bending line orthogonal thereto.

According to the present embodiment, it is possible to improve the flow of hot water during molding between the openings through which the connectors penetrate while suppressing the deformation of the case of the electronic control device of which the size has increased as the result of the increase in the level of functionality of the electronic control device.

Modified Example

Figure 9:
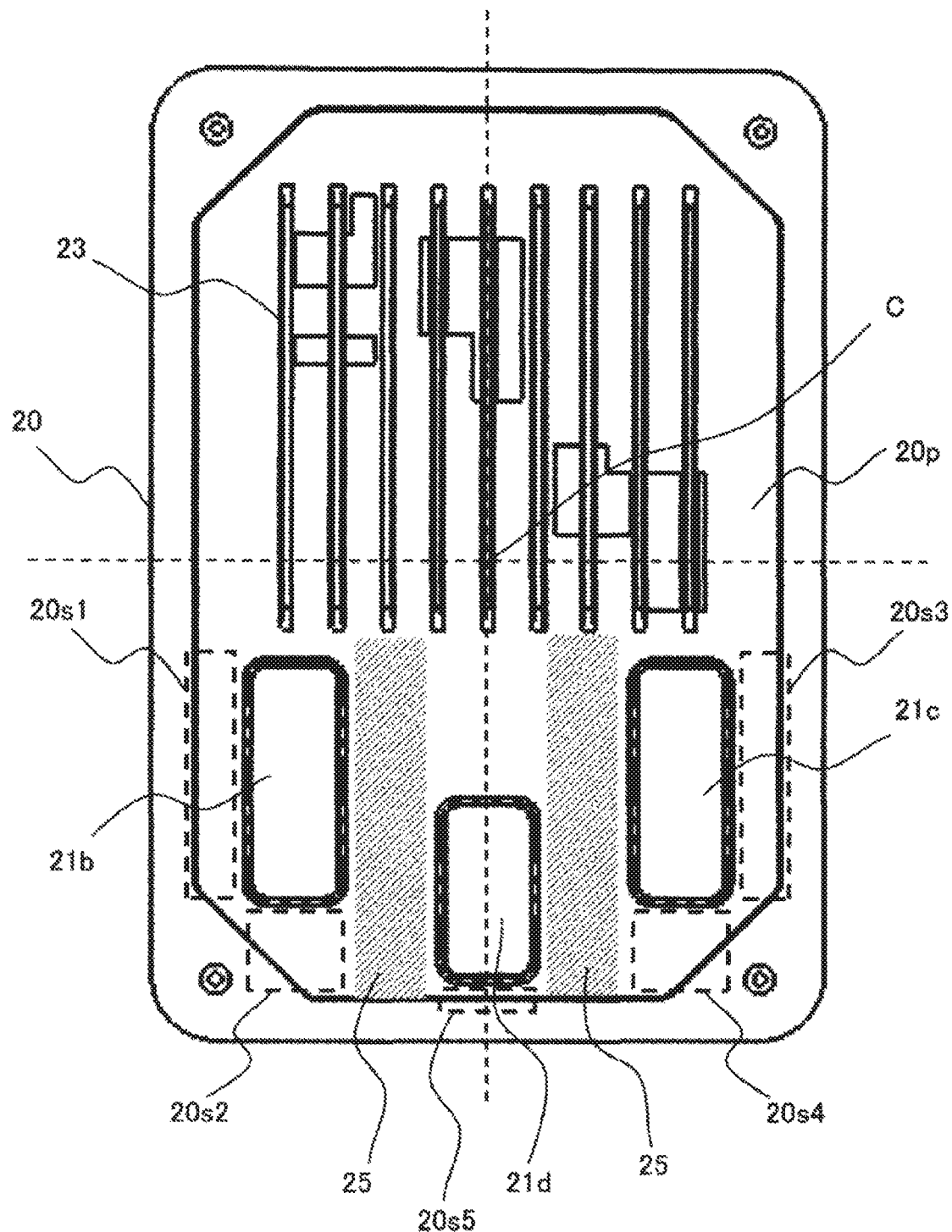
FIG. 9 is a view for describing a modification of the case of the electronic control device according to the sixth embodiment of the present invention.

FIG. 9 is a view for describing a modification of the case 20 of the electronic control device 1 according to the sixth embodiment of the present invention. The case 20 has a slope (part indicated by a frame line 20s1) in contact with a long side opposing along side of the first opening 21b on the center C side of the plane 20p and a slope (part indicated by a frame line 20s2) in contact with a short side opposing a short side of the first opening 21b on the center C side of the plane 20p.

In addition, the case 20 has a slope (part indicated by a frame line 20s3) in contact with a long side opposed to a long side of the second opening 21c on the center C side of the plane 20p, and a slope (part indicated by a frame line 20s4) in contact with a short side opposing a short side of the second opening 21c on the center C side of the plane 20p.

In addition, the case 20 has a slope (part indicated by a frame line 20s5) in contact with a short side opposing a short side of the third opening 21d on the center C side of the plane 20p.

According to this modification, a drainage property is further improved.

Incidentally, the present invention is not limited to the above-described embodiments, and includes various modification examples. For example, the above-described embodiments have been described in detail in order to describe the present invention in an easily understandable manner, and are not necessarily limited to one including the entire configuration that has been described above. In addition, some configurations of a certain embodiment can be substituted by configurations of another embodiment, and further, a configuration of another embodiment can be added to a configuration of a certain embodiment. In addition, addition, deletion or substitution of other configurations can be made with respect to some configurations of each embodiment.

REFERENCE SIGNS LIST 1 electronic control device
10 printed wiring board
20 case
20a opening edge
21 opening
21a convex portion of opening
21b first opening
21c second opening
21d third opening
21e region overlapping in longitudinal direction
21e length overlapping in longitudinal direction
21g length of opening in longitudinal direction
21h width of opening
22 cover
23 heat dissipation fin
24 wall thickness
24a wall thickness between opening and opening
24b rib
25 V groove
30 seal material
31 seal material
32 heat dissipation adhesive
40 screw
41 screw
50 connector
50a first connector
50b second connector
50c third connector
51 housing
52 housing groove
53 terminal

The invention claimed is:

1. An electronic control device comprising:
at least three connectors;
a rectangular case having long sides and short sides in which at least three openings through which the at least three connectors are provided on a plane; and
a board which is housed inside the case and to which the at least three connectors are electrically connected, wherein
a third opening is disposed between a first opening and a second opening,
an outer edge of the third opening is disposed at a position farthest from a center of the plane along a longitudinal direction of the case than an outer edge of the first opening and an outer edge of the second opening,
the first opening is adjacent to a first long side of the long sides and a first short side of the short sides of the rectangular case,
the second opening is adjacent to a second long side of the long sides and the first short side of short sides of the rectangular case,
the third opening is adjacent to the first opening, the second opening, and the short side of the rectangular case,
a length between the short side of the rectangular case and the outer edge of the third opening is smaller than a length between the short side of the rectangular case and the outer edge of the first opening and a length between the short side of the rectangular case and the outer edge of the second opening,
the first opening, the second opening, and the third opening are rectangular,
longitudinal directions of the first, second, and third openings are the same, and
a middle of the third opening has a smaller area than the first opening or the second opening,
a thickness of the case in an entire first region between and connecting a wall of the case surrounding the first opening and a wall of the case surrounding the third opening and a thickness of the case in an entire second region between and connecting a wall of the case surrounding the second opening and the wall of the case surrounding the third opening are larger than a thickness of the entire case excluding the entire first region and the entire second region.

2. The electronic control device according to claim 1, wherein an area of the third opening is smaller than each area of the first and the second openings.

3. The electronic control device according to claim 1, wherein a length of the third opening in the longitudinal direction is smaller than each length of the first and the second openings in the longitudinal direction.

4. The electronic control device according to claim 1, wherein a length of the third opening in a lateral direction is smaller than each length of the first and second openings in the lateral direction.

5. The electronic control device according to claim 1, wherein the case has ribs between the first opening and the third opening, and between the second opening and the third opening.

6. The electronic control device according to claim 1, wherein the case has heat dissipation fins, and extension portions obtained by extending the heat dissipation fins between the first opening and the third opening, and between the second opening and the third opening.

7. The electronic control device according to claim 6, wherein a height of the extension portion is lower than a height of the heat dissipation fin.

8. The electronic control device according to claim 1, wherein the case has a heat dissipation fin and an extension portion obtained by extending the heat dissipation fin to a front of a short side of the third opening on the center side of the plane.

9. The electronic control device according to claim 1, wherein the case has V-shaped grooves between the first opening and the third opening, and between the second opening and the third opening.

10. The electronic control device according to claim 9, wherein the case has
a slope in contact with a long side opposing a long side of the first opening on the center side of the plane,
a slope in contact with a short side opposing a short side of the first opening on the center side of the plane,
a slope in contact with a long side opposing a long side of the second opening on the center side of the plane,
a slope in contact with a short side opposing the short side of the second opening on the center side of the plane, and
a slope in contact with a short side opposing a short side of the third opening on the center side of the plane.

11. The electronic control device according to claim 1, wherein an outer shape of the case is larger than 240 mm×160 mm.

12. The electronic control device according to claim 1, wherein a number of openings which are disposed next to each other is three.

* * * * *